(12) United States Patent
Fishburn et al.

(10) Patent No.: US 7,321,150 B2
(45) Date of Patent: Jan. 22, 2008

(54) SEMICONDUCTOR DEVICE PRECURSOR STRUCTURES TO A DOUBLE-SIDED CAPACITOR OR A CONTACT

(75) Inventors: Fred Fishburn, Boise, ID (US); Forest Chen, Boise, ID (US); John M. Drynan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 81 days.

(21) Appl. No.: 11/030,696

(22) Filed: Jan. 6, 2005

(65) Prior Publication Data
US 2005/0118760 A1 Jun. 2, 2005

Related U.S. Application Data

(62) Division of application No. 10/714,115, filed on Nov. 13, 2003, now Pat. No. 6,962,846.

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/309; 257/307; 257/311

(58) Field of Classification Search ........ 257/306–309, 257/311; 438/243–244, 254, 397
See application file for complete search history.

(56) References Cited

U.S. PATENT DOCUMENTS

| | | | |
|---|---|---|---|
| 5,278,091 A | 1/1994 | Fazan et al. | |
| 5,354,705 A | 10/1994 | Mathews et al. | |
| 5,958,587 A | 9/1999 | Chen et al. | |
| 6,180,450 B1 | 1/2001 | Dennison et al. | |
| 6,204,143 B1 | 3/2001 | Roberts et al. | |
| 6,312,986 B1 | 11/2001 | Hermes | |
| 6,372,574 B1 | 4/2002 | Lane et al. | |
| 6,451,661 B1 | 9/2002 | DeBoer et al. | |
| 6,451,667 B1 | 9/2002 | Ning | |
| 6,507,064 B1 | 1/2003 | Tang et al. | |
| 6,524,912 B1 | 2/2003 | Yang et al. | |
| 6,667,209 B2 * | 12/2003 | Won et al. | 438/253 |
| 6,999,298 B2 * | 2/2006 | Hackler et al. | 361/303 |
| 2001/0054764 A1 | 12/2001 | Nitta et al. | |
| 2002/0090779 A1 | 7/2002 | Jang | |
| 2002/0109170 A1 * | 8/2002 | Tang et al. | 257/296 |
| 2002/0168830 A1 * | 11/2002 | DeBoer et al. | 438/396 |
| 2003/0001268 A1 | 1/2003 | Oh | |
| 2003/0129805 A1 | 7/2003 | Kim | |
| 2004/0077143 A1 | 4/2004 | Lee et al. | |

* cited by examiner

*Primary Examiner*—Shouxiang Hu
(74) *Attorney, Agent, or Firm*—TraskBritt

(57) ABSTRACT

A method of forming a double-sided capacitor using at least one sacrificial structure, such as a sacrificial liner or a sacrificial plug. A sacrificial liner is formed along sidewalls of at least one opening in an insulating layer on a semiconductor wafer. A first conductive layer is then formed over the sacrificial liner. The sacrificial liner is then selectively removed to expose a first surface of the first conductive layer without damaging exposed components on the semiconductor wafer. Removing the sacrificial liner forms an open space adjacent to the first surface of the first conductive layer. A dielectric layer and a second conductive layer are formed in the open space, producing the double-sided capacitor. Methods of forming a double-sided capacitor having increased capacitance and a contact are also disclosed. In addition, an intermediate semiconductor device structure including at least one sacrificial structure is also disclosed.

5 Claims, 13 Drawing Sheets

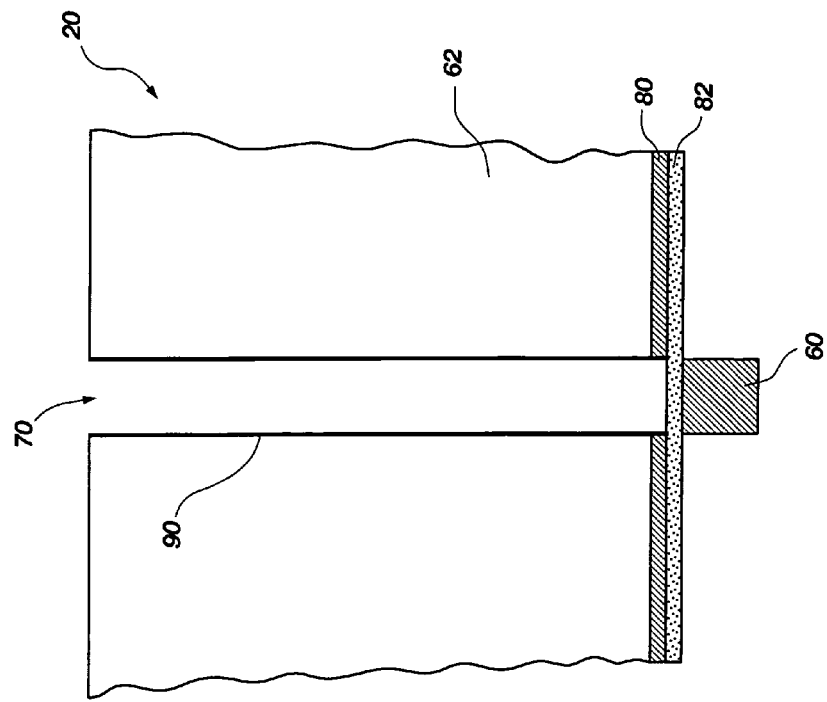
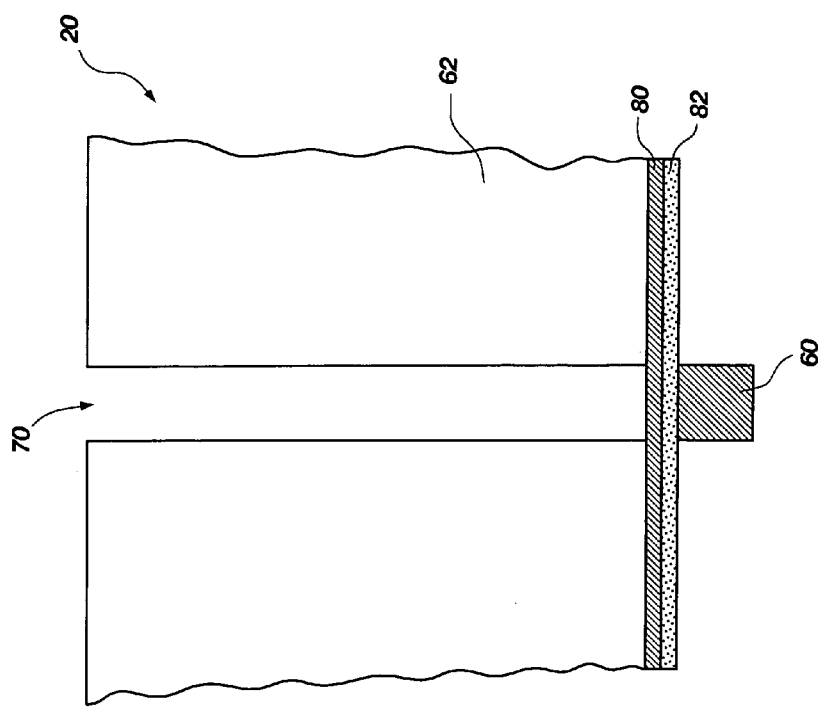

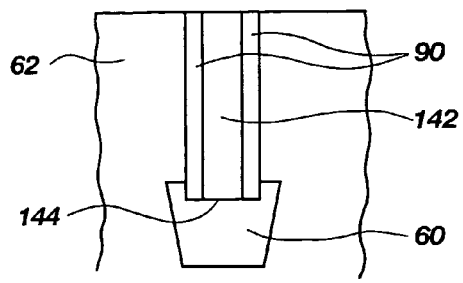
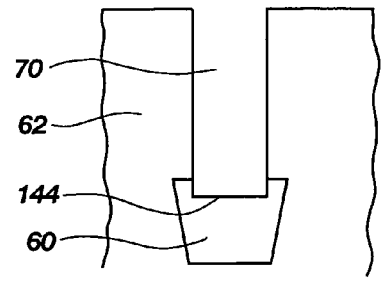
FIG. 15         FIG. 14
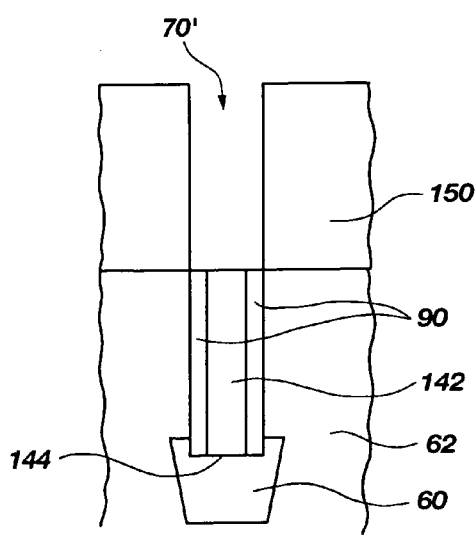
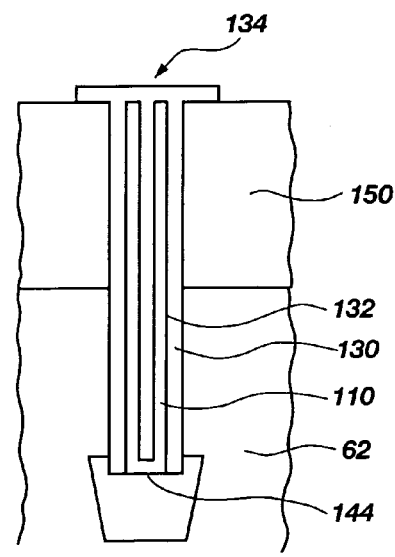
FIG. 16         FIG. 20
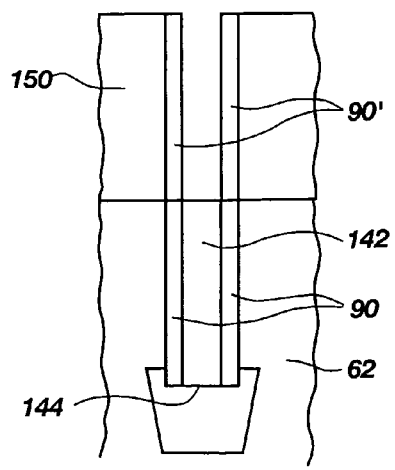
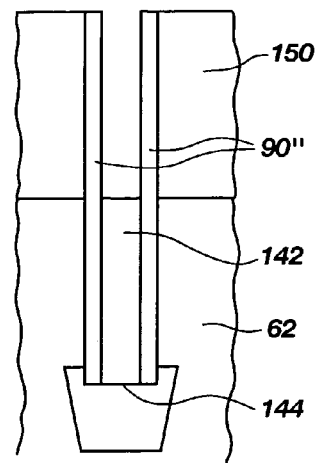
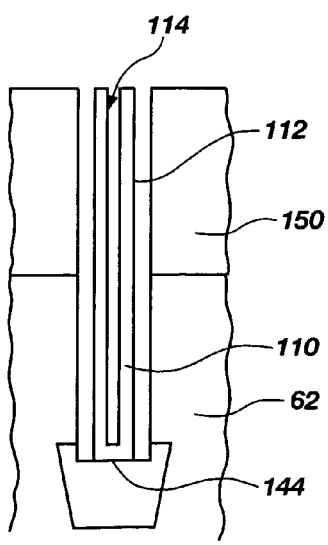
FIG. 17     FIG. 18     FIG. 19

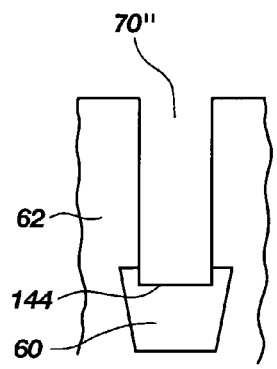
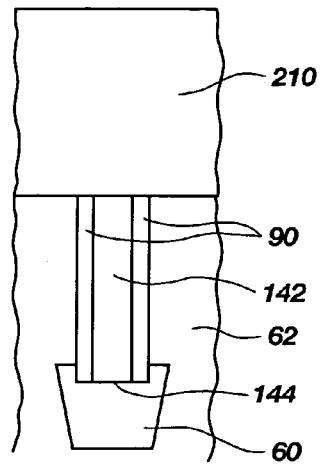
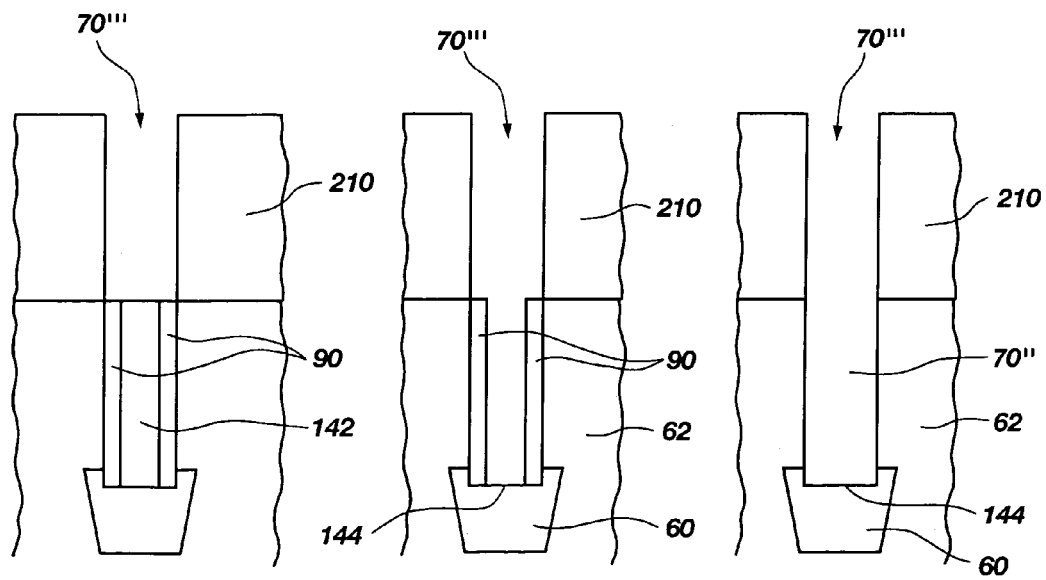

SEMICONDUCTOR DEVICE PRECURSOR STRUCTURES TO A DOUBLE-SIDED CAPACITOR OR A CONTACT

CROSS-REFERENCE TO RELATED APPLICATION

This application is a divisional of application Ser. No. 10/714,415, filed Nov. 13, 2003, now U.S. Pat. No. 6,962,846 issued Nov. 8, 2006.

BACKGROUND OF THE INVENTION

1. Field of the Invention

The present invention relates to the fabrication of semiconductor devices and, more specifically, to the fabrication of double-sided capacitors and contacts using a sacrificial structure.

2. State of the Art

Capacitors are used in a wide variety of semiconductor circuits, such as in dynamic random access memory ("DRAM") circuits. While the invention herein is discussed in relation to DRAM circuits, the applicability of the invention is not limited to DRAM circuits and may be used in any other type of memory circuits, such as static random access memory ("SRAM") circuits or any other circuits in which capacitors are used.

DRAM circuits are manufactured by replicating millions of identical circuit elements, known as DRAM cells, on a single semiconductor wafer. A DRAM cell, usually consisting of a single metal-oxide semiconductor field effect transistor ("MOSFET") and a single capacitor, is an addressable location that can store one bit (binary digit) of data. The DRAM cell stores a bit of data on the capacitor as an electrical charge. Manufacturing of the DRAM cell typically includes fabricating a transistor, a capacitor, and three contacts: one contact each to a bit line, a word line, and a reference voltage. DRAM manufacturing is a highly competitive business and there is continuous pressure to decrease the size of individual cells and increase memory cell density to allow more memory to be squeezed onto a single memory chip. However, it is also necessary to maintain a sufficiently high storage capacitance to maintain a charge at the refresh rates currently in use even as cell size continues to shrink. This requirement has led DRAM manufacturers to turn to three-dimensional capacitor designs, including trench and stacked capacitors. Stacked capacitors are capacitors that are stacked, or placed, over an access transistor in a semiconductor device. In contrast, trench capacitors are formed in the wafer substrate beneath the transistor. For reasons including ease of fabrication and increased capacitance, most manufacturers of DRAMs larger than-4 four Megabits use stacked capacitors.

A widely used type of stacked capacitor is known as a container capacitor. Container capacitors are typically in the shape of an upstanding tube or cylinder having an oval or circular cross section. FIG. 1 illustrates a top view of a portion of a DRAM circuit from which the upper layers have been removed to reveal container capacitors 12 arranged around a bit line contact 14. Six container capacitors 12 are shown in FIG. 1, each of which is labeled with separate reference designations A to F. In FIG. 1, the bit line contact 14 is shared by DRAM cells corresponding to container capacitors A and B. The wall of each cylinder consists of two layers or plates of conductive material, such as doped polycrystalline silicon (referred to herein as "polysilicon" or "poly") separated by a dielectric layer. One of the plates is a bottom electrode, while the second of the plates is a top electrode. The bottom end of the cylinder is closed, with the bottom electrode of the cylinder in contact with either a drain of the access transistor or a plug, which itself is in contact with the drain. The other end of the cylinder is open. Later in the fabrication process, the open end of the cylinder is filled with an insulative material. The sidewall and closed end of the cylinder form a container, which leads to the name "container capacitor." Although the invention will be further discussed in connection with stacked container capacitors, it is understood that the invention is not limited thereto. For example, use of the invention in trench capacitors is also possible.

In addition to being conductive, the bottom and top electrodes in the DRAM cell capacitor protect the dielectric layer from interaction with interlayer dielectrics (e.g., borophosphosilicate glass ("BPSG")) and from the harsh thermal processing encountered in subsequent processing. For instance, tantalum pentoxide ("$Ta_2O_5$") is commonly used in the dielectric layer for high density DRAMs, such as 64-Mbit and 256-Mbit DRAMs, because chemical vapor deposition ("CVD") of $Ta_2O_5$ provides a high dielectric constant (about 20-25) and good step coverage. However, when rapid thermally processed nitride ("RTN") is formed over a layer of hemispherical grain polysilicon ("HSG") to serve as an HSG barrier layer to prevent oxidation of HSG during subsequent $Ta_2O_5$ deposition, there is a capacitance loss due to the RTN layer on the capacitor electrode. The effective dielectric constant for an RTN/$Ta_2O_5$ stack capacitor is about 10-12.

Several approaches have been attempted to increase the capacitance in the container capacitor, such as by increasing the length of the capacitor and by increasing the surface area of the electrodes. For instance, the surface area of the electrodes has been increased by using HSG in the electrodes or by forming a double-sided capacitor. In the double-sided capacitor, the bottom electrode is typically surrounded on two sides by the top electrode, as described in U.S. Pat. No. 6,451,661 to DeBoer et al. Double-sided capacitors are typically formed by depositing the bottom electrode in an opening formed in a semiconductor wafer. The material of the bottom electrode is etched back or removed from a surface of the semiconductor wafer by chemical mechanical planarization ("CMP"). After etching a field oxide from the semiconductor wafer, the double-sided capacitor is formed on the semiconductor wafer surface. One problem with forming the double-sided capacitor is that the bottom electrode protrudes from the semiconductor wafer by about 1.5 μm to about 2 μm. The protruding bottom electrode is easily broken and causes problems with toppling. An additional problem is that the length of the top and bottom electrodes is limited due to problems with toppling. While it is possible to increase the electrode length by increasing the etch depth of the opening in which the electrodes are to be deposited, in practice, this causes a narrowing of the opening and, therefore, electrodes having the desired length are hard to achieve. Furthermore, a significant step height exists between the resulting capacitor and surrounding circuitry. The step height is difficult to reduce without depositing a thin layer of oxide and planarizing the layer. However, this adds an additional CMP step to the processing, which adds additional steps and complexity to the fabrication of the double-sided capacitor.

While double-sided capacitors are advantageous in that they provide additional capacitance, forming the double-sided capacitors is a complex process and requires additional processing steps. As memory cell density continues to increase, a double-sided capacitor having an increased effective capacitance per cell is needed. Furthermore, a double-sided capacitor that is formed using less complex processing techniques and fewer processing steps is needed.

BRIEF SUMMARY OF THE INVENTION

The present invention, in one embodiment, relates to a method of forming a double-sided capacitor. The method comprises forming at least one opening in an insulating layer on a semiconductor wafer. A sacrificial liner is formed along sidewalls of the at least one opening. The sacrificial liner is formed from a material, for example, such as titanium nitride, polysilicon or hemispherical grain polysilicon. A first conductive layer having a first surface and a second surface is then formed over the sacrificial liner, with the first surface of the first conductive layer contacting the sacrificial liner. The sacrificial liner is then selectively removed using, for example, a solution of hydrogen peroxide and sulfuric acid or a solution of tetramethylammonium hydroxide to expose the first surface of the first conductive layer. The sacrificial liner is selectively removed without damaging exposed components on the semiconductor wafer, such as the first conductive layer. Removing the sacrificial liner forms an open space adjacent to the first surface of the first conductive layer. A dielectric layer is formed in the open space, over the first and second surfaces of the first conductive layer. A second conductive layer is formed over the dielectric layer, producing the double-sided capacitor.

The present invention, in another embodiment, relates to a method of forming a double-sided capacitor exhibiting increased capacitance. The method comprises forming a first opening in a first insulating layer on a semiconductor wafer. A first sacrificial liner is formed along sidewalls of the first opening from a material, for example, such as titanium nitride, polysilicon or hemispherical grain polysilicon. A sacrificial plug is formed adjacent to the first sacrificial liner. The sacrificial plug is formed from a material having a different etch selectivity than a material used in the first sacrificial liner. For instance, if the first sacrificial liner is formed from titanium nitride, the sacrificial plug may be formed from polysilicon or hemispherical grain polysilicon. Alternatively, if the first sacrificial liner is formed from polysilicon or hemispherical grain polysilicon, the sacrificial plug may be formed from titanium nitride.

A second insulating layer is then formed over the first insulating layer. A second opening is formed in the second insulating layer, the second opening being in substantial alignment with the first opening. A second sacrificial liner is formed along sidewalls of the second opening. The sacrificial plug is then removed without removing or damaging the first and second sacrificial liners. A first conductive layer is formed over the first and second sacrificial liners. The first conductive layer has a first surface and a second surface, wherein the first surface of the first conductive layer contacts the first and second sacrificial liners. The first and second sacrificial liners are selectively removed, which forms an open space adjacent to the first surface of the first conductive layer and exposes the first surface of the first conductive layer. Then, a dielectric layer is formed in the open space and over the first and second surfaces of the first conductive layer. A second conductive layer is then formed over the dielectric layer.

In another embodiment, the present invention relates to a method of forming a contact. The method comprises forming a first opening in a first insulating layer on a semiconductor wafer. A sacrificial liner is formed along sidewalls of the first opening from a material, such as, for example, titanium nitride, polysilicon or hemispherical grain polysilicon. A sacrificial plug is formed adjacent to the sacrificial liner. The sacrificial plug is formed from a material having a different etch selectivity than a material used in the sacrificial liner. A second insulating layer is formed over the first insulating layer and a second opening is formed in the second insulating layer, the second opening in substantial alignment with the first opening. The sacrificial plug or both the sacrificial plug and the sacrificial liner are removed from the first opening without damaging exposed components on the semiconductor wafer. A conductive material is deposited in the first and second openings, forming the contact.

The present invention also relates to an intermediate semiconductor device structure including a precursor structure to a double-sided capacitor or contact being fabricated. The intermediate semiconductor device structure may include at least one sacrificial structure and additional components on the semiconductor wafer, such as a bottom electrode.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 8-13 are cross-sectional views of a portion of the semiconductor wafer according to an embodiment of the present invention;

FIGS. 14-20 are cross-sectional views of a portion of the semiconductor wafer according to another embodiment of the present invention;

FIGS. 21-27 are cross-sectional views of a portion of the semiconductor wafer according to another embodiment of the present invention.

DETAILED DESCRIPTION OF THE INVENTION

In the present invention, a double-sided capacitor or a contact may be formed on a semiconductor wafer using at least one sacrificial structure. As used herein, the term "double-sided capacitor" refers to a metal-insulator-metal ("MIM") capacitor or a metal-insulator-semiconductor ("MIS"). As used herein, the term "sacrificial structure" refers to a structure formed in an opening on the semiconductor wafer in which the double-sided capacitor is ultimately to be formed. The sacrificial structure will ultimately be removed in subsequent processing. The sacrificial structure may also be used to form a contact on the semiconductor wafer. The shape of the sacrificial structure is not critical to the operability of the present invention and may include, but is not limited to, a sacrificial liner and a sacrificial plug. The sacrificial structure maintains the integrity of the opening on the semiconductor wafer in which the double-sided capacitor or contact is to be formed. Using the sacrificial structure provides a less complex method of forming a double-sided capacitor or contact because less processing, such as etching or masking, may be required.

The material used in the sacrificial structure may be selected so that the sacrificial structure is removable from the opening without removing or damaging other components or portions of the semiconductor wafer. In other words, etching conditions used to remove the sacrificial structure may be chosen based on the material of the sacrificial structure and the materials of the other components on the semiconductor wafer. For instance, the sacrificial structure may be selectively removed without removing or damaging a bottom electrode of the double-sided capacitor. For sake of example only, the sacrificial structure may be formed from polysilicon while the bottom electrode may be formed from titanium nitride ("TiN"). Alternatively, one sacrificial structure may be formed from TiN while a second sacrificial structure may be formed from polysilicon. Conventional etching conditions, such as a wet etch process or a dry etch process, may be used to remove the sacrificial structure. In addition, one sacrificial structure may be removed without removing other sacrificial structures on the semiconductor wafer. For instance, a sacrificial plug may be removed from the opening without removing a sacrificial liner. The sacrificial liner may subsequently be removed from the opening without removing or damaging other components on the semiconductor wafer, such as the bottom electrode. When the sacrificial structure is removed, space previously occupied by the sacrificial structure may be used to form the double-sided capacitor or the contact.

Figure 1:
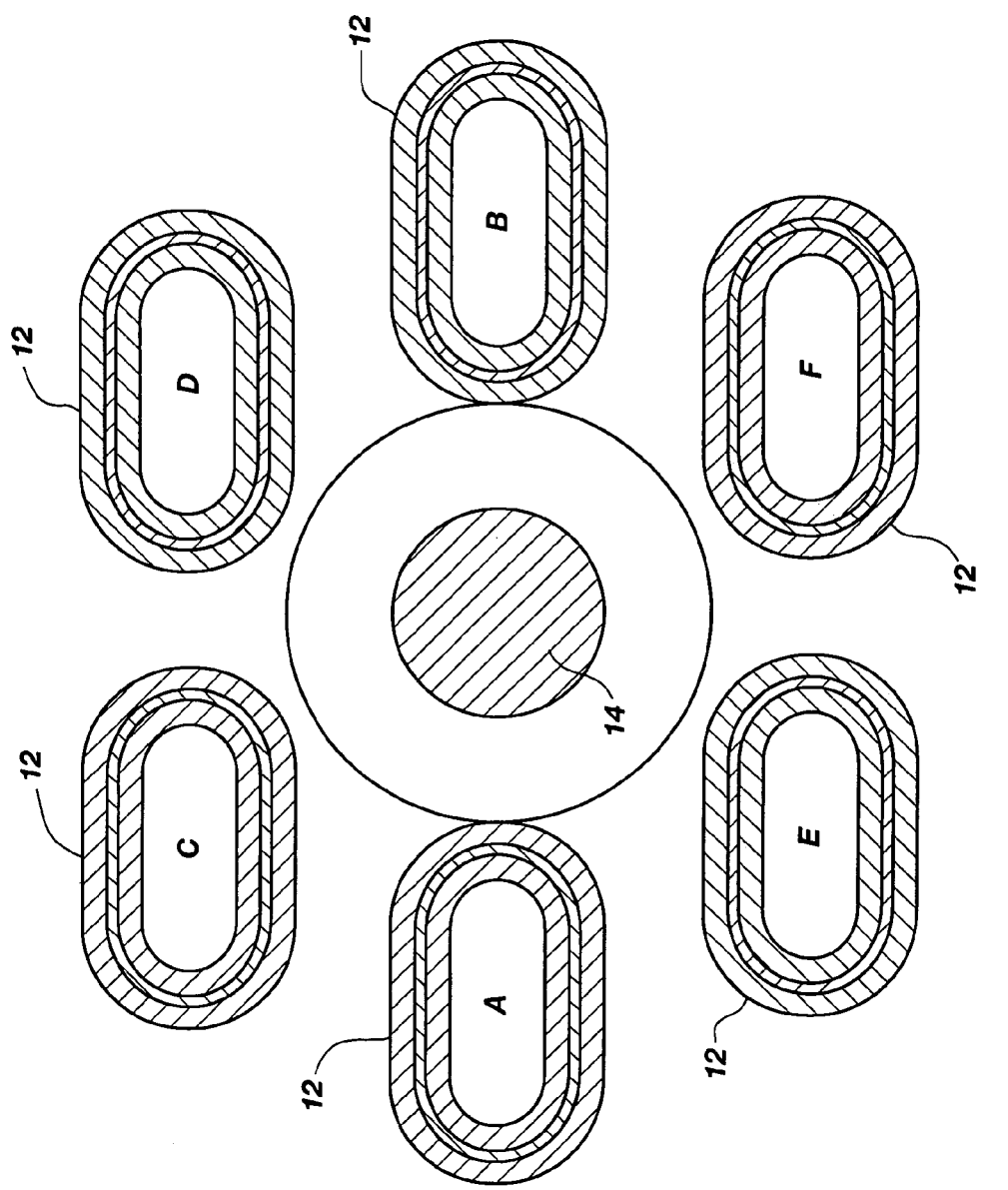
FIG. 1 is a top view of a cross-section of a known memory circuit showing a number of container capacitors surrounding a bit line contact.
Figure 2:
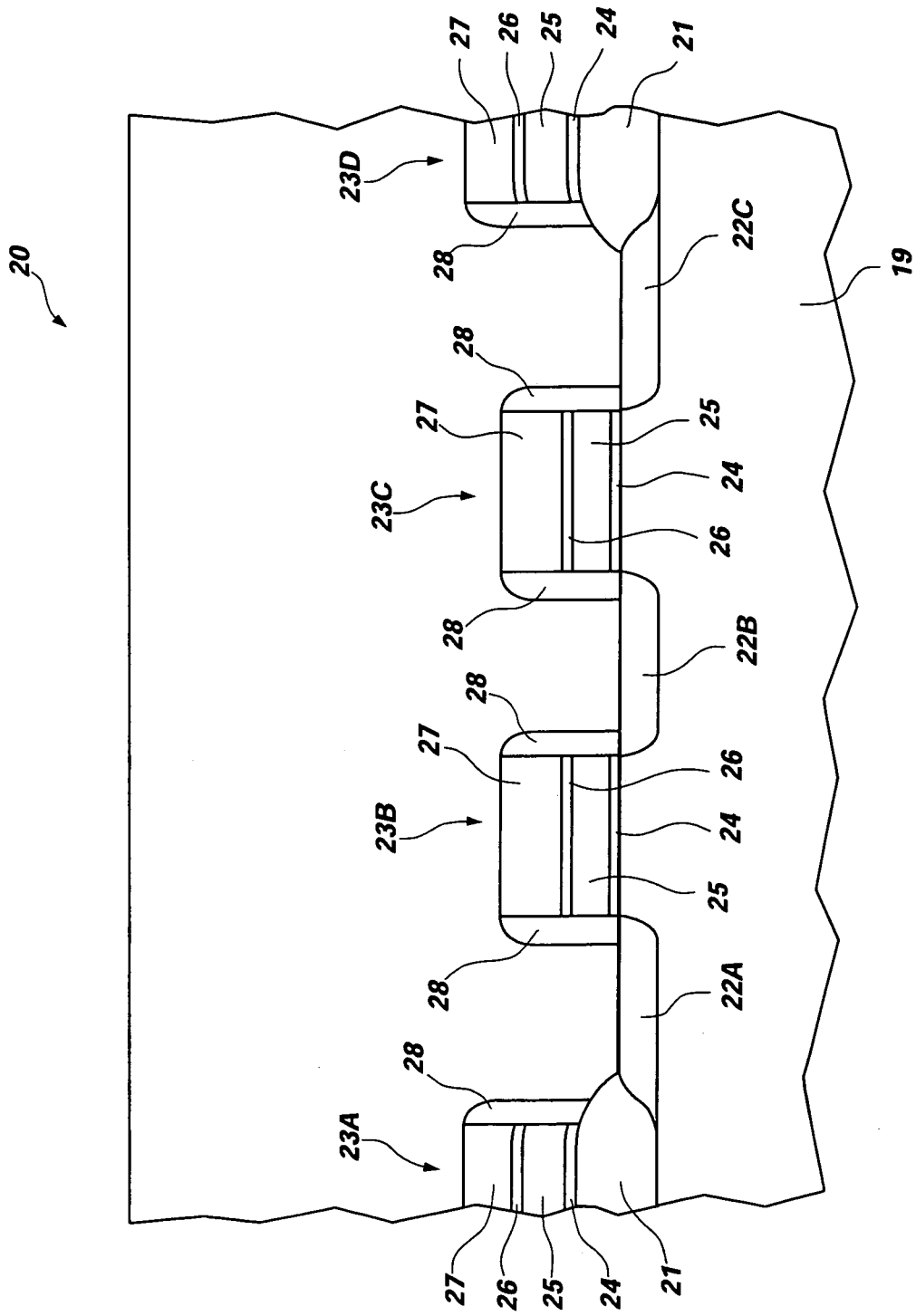
FIGS. 2-7 are cross-sectional views of a portion of a semiconductor wafer at an early processing step.

A semiconductor wafer 20 at an early stage of processing is shown in FIG. 2. The semiconductor wafer 20 may include a substate 19. As used herein, the term "substrate" refers to a conventional substrate or other bulk substrate having a layer of semiconductor material. The term "bulk substrate" as used herein includes not only silicon wafers, but also silicon on insulator ("SOI") substrates, silicon on sapphire ("SOS") substrates, epitaxial layers of silicon on a base semiconductor foundation and other semiconductor materials such as silicon-germanium, germanium, gallium arsenic or indium phosphide. The semiconductor wafer 20 may include field isolation oxide regions 21 and active areas 22A, 22B, 22C formed therein. Word lines 23A, 23B, 23C, 23D may be constructed on the semiconductor wafer 20 in a conventional manner. Each word line 23A, 23B, 23C, 23D includes a lower gate oxide 24, a lower polycrystalline silicon layer 25, a higher conductivity silicide layer 26, and an insulating silicon nitride cap 27 and may also be provided with insulating spacers 28, which are also composed of silicon nitride. The semiconductor wafer 20 may also include field effect transistors ("FET"). Two FETs are shown in FIG. 2, with one FET having two active areas (source/drain) 22A, 22B and one word line (gate) 23B. The second FET may include two active areas (source/drain) 22B, 22C and a second word line (gate) 23C. The active area 22B common to both FETs may be the active area over which the bit line contact 14 will be formed.

Figure 3:
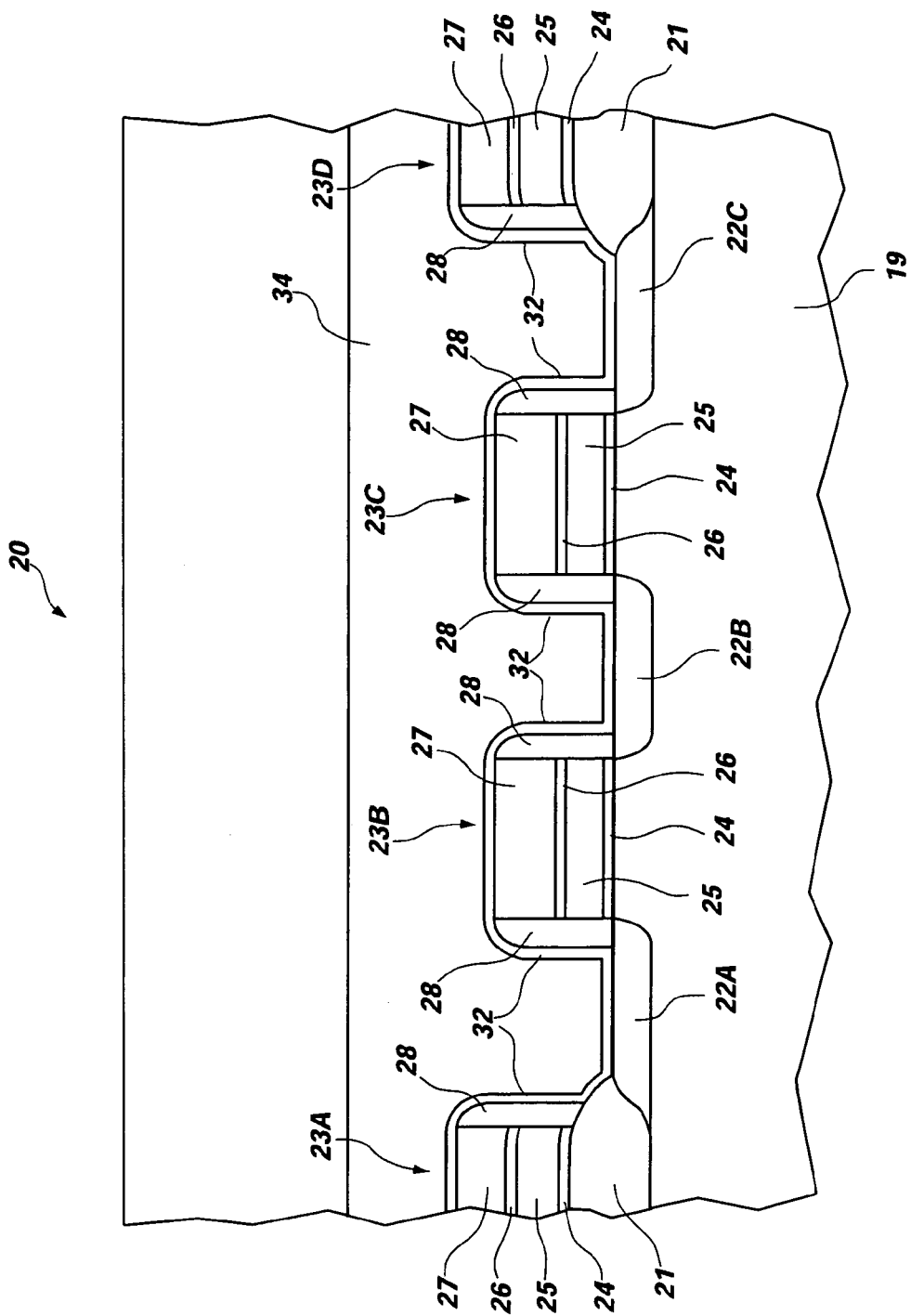
Figure 4:
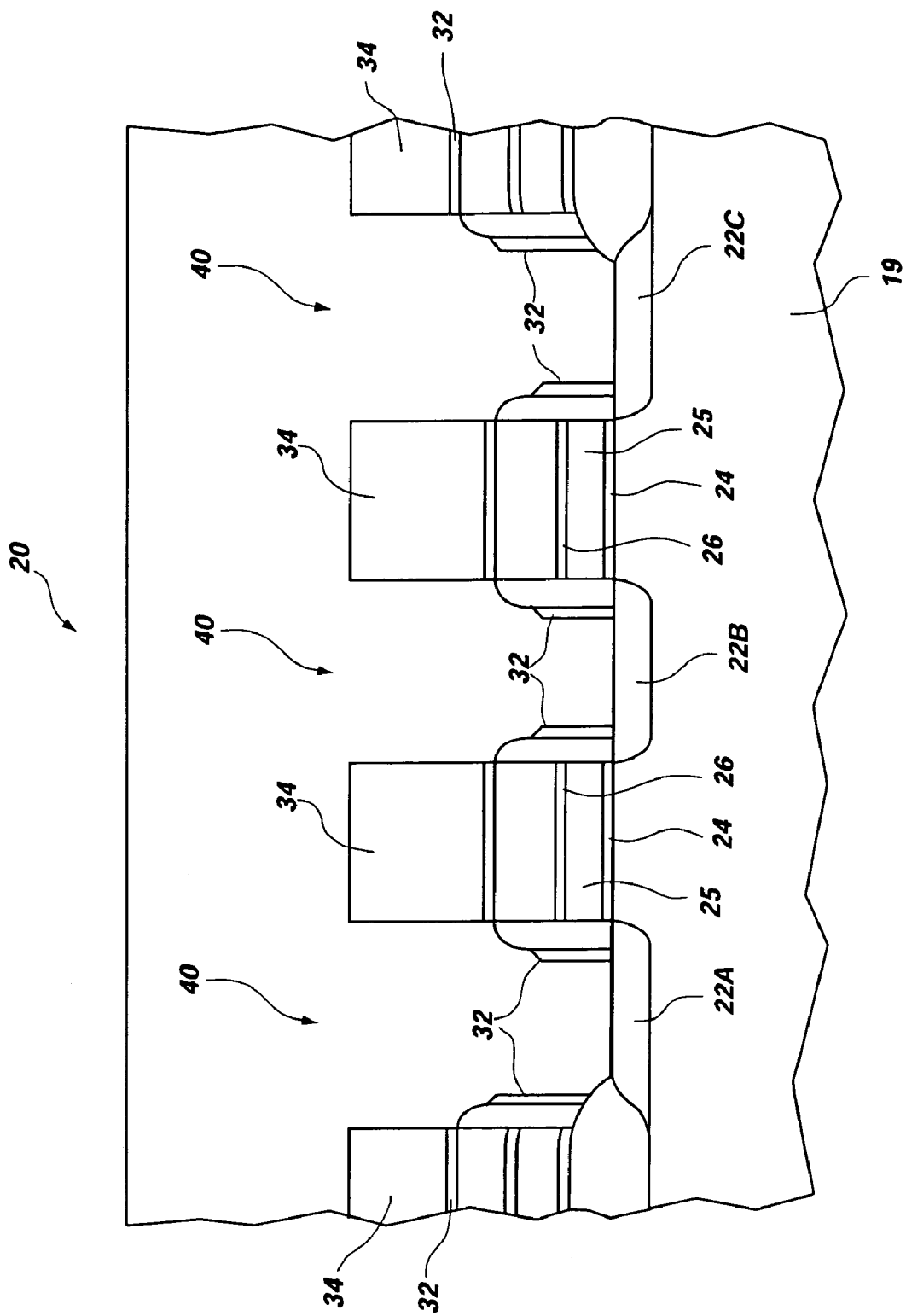

As shown in FIG. 3, a thin layer 32 of nitride or TEOS ("tetraethyl or orthosilicate") may be formed over the semiconductor wafer 20 followed by a first insulating layer 34. The material used in the first insulating layer 34 may include, but is not limited to, BPSG or phosphosilicate glass ("PSG"). The first insulating layer 34 may subsequently be planarized by CMP, as shown in FIG. 4. The plug openings 40 may be formed by photomasking and dry chemical etching the first insulating layer 34 relative to the thin nitride layer 32, as known in the art.

Figure 5:
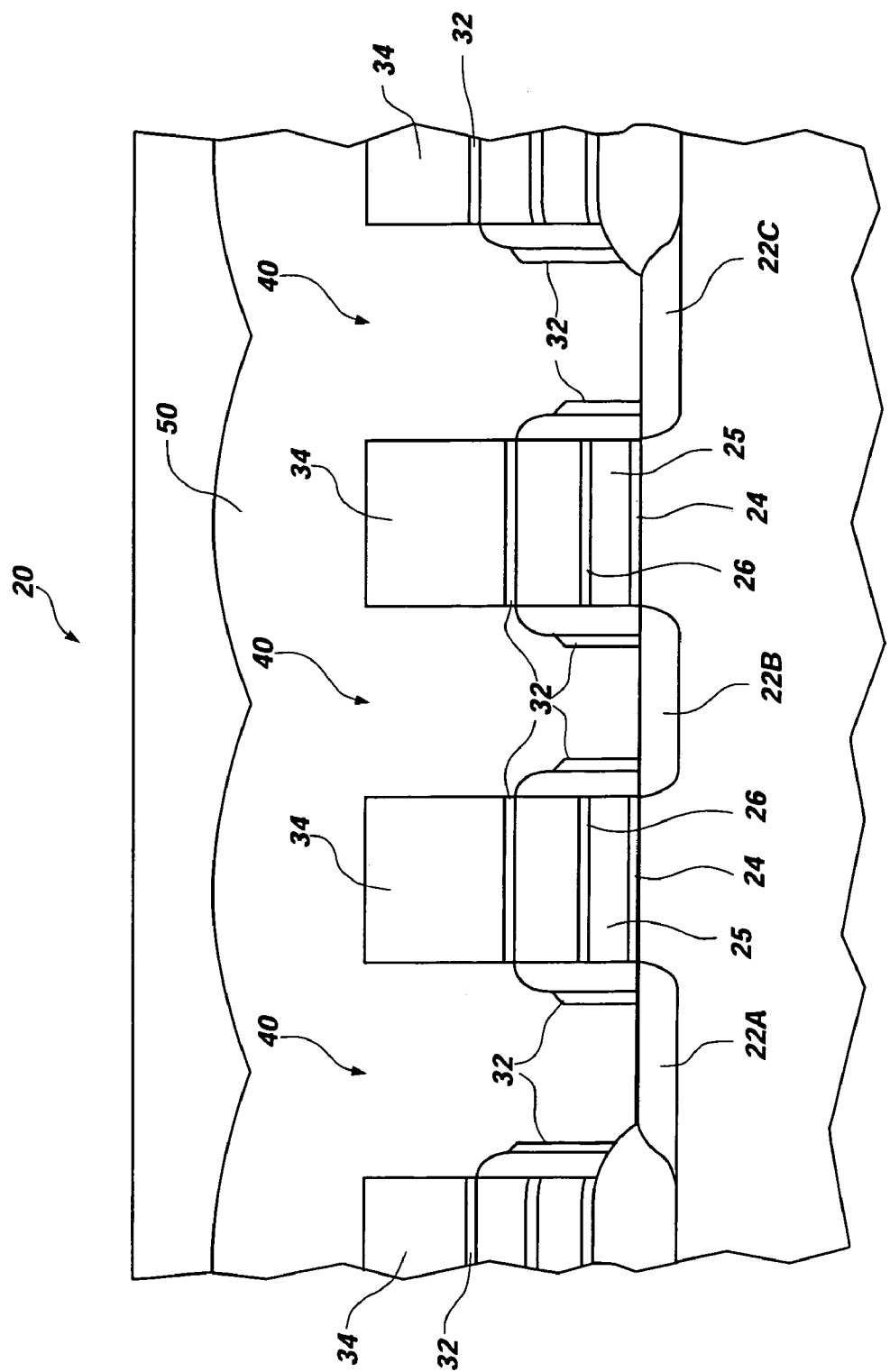
Figure 6:
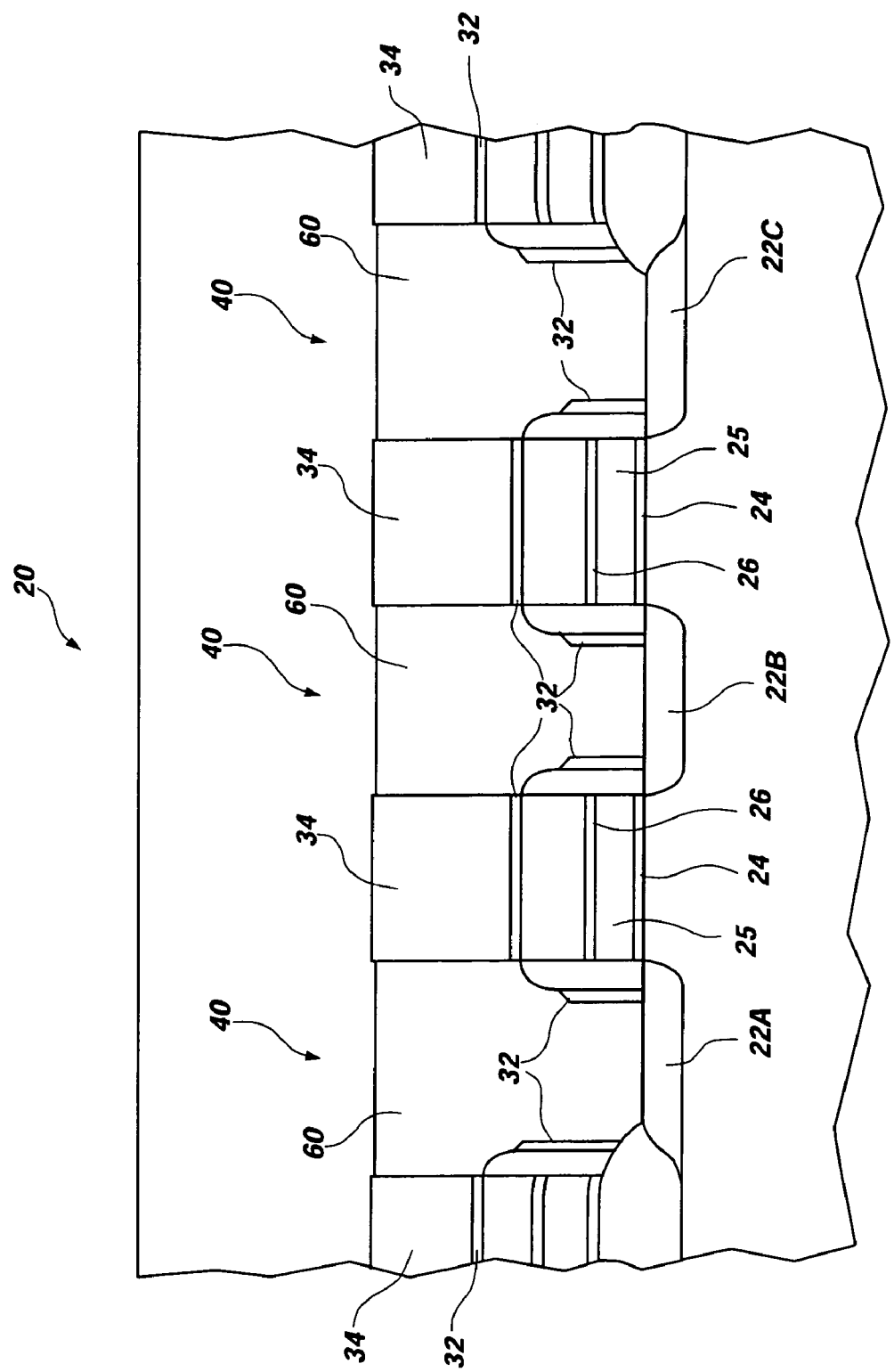

Referring now to FIG. 5, a conductive layer 50 may be formed to provide conductive material within the plug openings 40. The conductive layer 50 may be in contact with the active areas 22A, 22B, 22C. The conductive material used to form the conductive layer 50 may be in situ arsenic, phosphorous doped polysilicon, or a metal. Portions of the conductive layer 50 may be removed to a point just below the upper surface of the first insulating layer 34 so that the remaining material of the conductive layer 50 forms electrically isolated plugs 60 over the active areas 22A, 22B, 22C as shown in FIG. 6. The portions of the conductive layer 50 may be removed by dry etching or CMP. A barrier layer (not shown) may be deposited over the plugs 60. The barrier layer may be formed from a conductive material suitable for reducing depletion effects, enhancing frequency response, providing barrier properties, and preventing diffusion of silicon and oxygen into the cell. The conductive material used in the barrier layer may include, but is not limited to, titanium nitride, aluminum nitride, titanium boride, zirconium boride, and hafnium boride. A second insulating layer 62, such as of BPSG or PSG, may be deposited over the first insulating layer 34.

Figure 7:
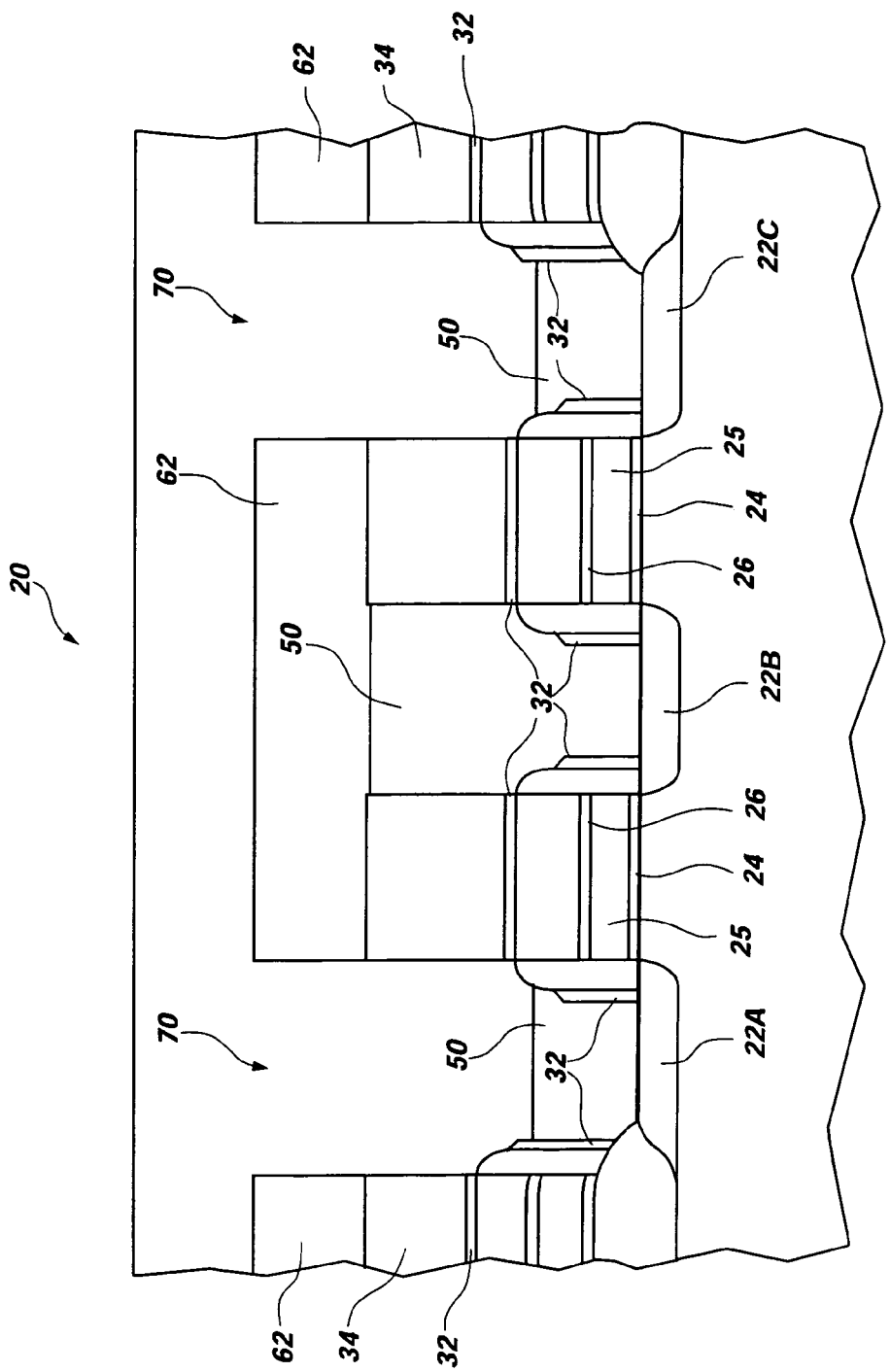

Openings 70 may then be formed in the second insulating layer 62 by conventional techniques, such as by photomasking and dry chemical etching the openings 70, as shown in FIGS. 7, 8, and 14. For the sake of convenience and clarity, FIGS. 8 and 14 are simplified to show an upper portion of the semiconductor wafer 20. The openings 70 may be formed overlying plugs 60 or other features in the semiconductor wafer 20. If the semiconductor wafer 20 includes the barrier layer, etching of the opening 70 may stop at the barrier layer. The opening 70 may be etched to a desired depth depending on a desired length or depth of the double-sided capacitor or the contact. The length of the double-sided capacitor may be determined by a height of the second insulating layer 62 above a surface of the top of the plug 60. For instance, the opening may be approximately 2 μm deep.

The sacrificial structure, such as the sacrificial liner or the sacrificial plug, may be deposited in the opening 70 and used to maintain space in the opening 70 that will ultimately be used in forming the double-sided capacitor or the contact. The sacrificial structure may be selectively removed from the opening 70, providing additional space in which to form the double-sided capacitor or the contact. In other words, the space previously occupied by the sacrificial structure may ultimately be occupied by the top electrode and dielectric layer of the double-sided capacitor or by a conductive layer of the contact. As described in detail herein, this may provide usable surface area from both the frontside and backside of the bottom electrode.

The sacrificial structure may be deposited in the opening 70 by conventional techniques including, but not limited to, CVD or atomic layer deposition ("ALD"). As previously mentioned, the sacrificial structure may be formed from a material that is capable of being selectively removed or etched from the opening 70 without damaging other components on the semiconductor wafer 20, such as the bottom electrode or other sacrificial structures. For the sake of example only, the sacrificial structure may be formed from titanium nitride, polysilicon, or HSG. For instance, if an MIS capacitor is ultimately to be formed, the sacrificial structure may be formed from TiN. Alternatively, the sacrificial structure may be formed from polysilicon or HSG if a MIM capacitor is to be formed. If HSG is used, the HSG may provide a rugged surface having additional surface area compared to that provided by polysilicon. When more than one sacrificial structure is present in the opening 70, each of the sacrificial structures may be formed from either TiN or one of polysilicon and HSG. For instance, the sacrificial liner may be formed from TiN while the sacrificial plug may be formed from polysilicon or HSG. Alternatively, the sacrificial liner may be formed from polysilicon or HSG while the sacrificial plug may be formed from TiN. Since each of these materials may be removed using different etching conditions, the sacrificial plug (or the sacrificial liner) may be selectively removed without removing or damaging the other sacrificial structure or the bottom electrode.

Figure 13:
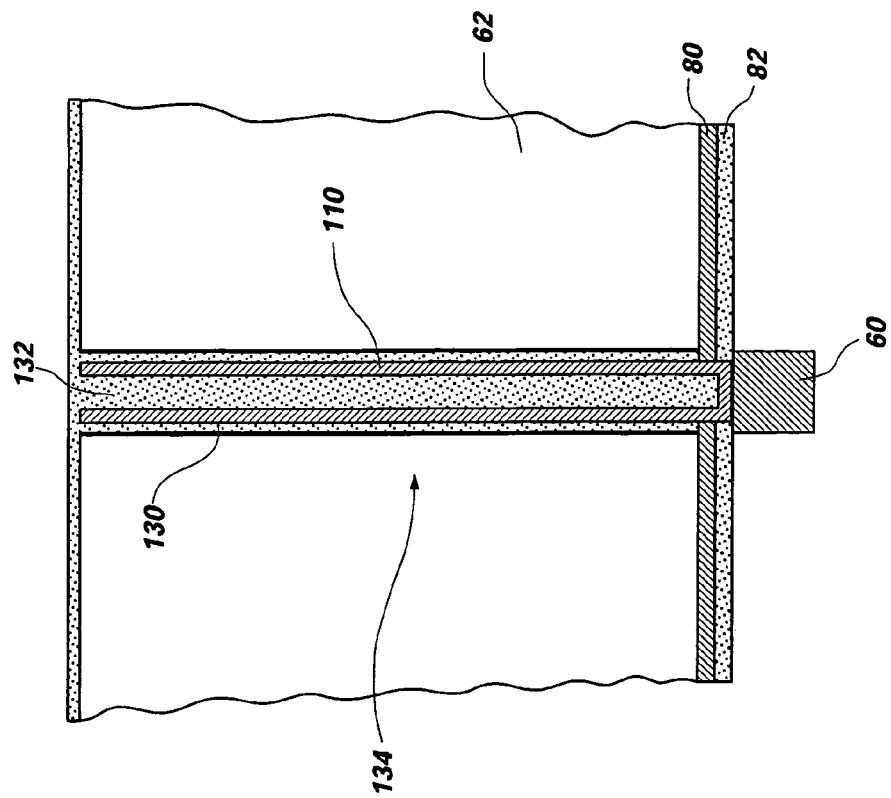

After depositing the sacrificial structure, a portion of the double-sided capacitor or the contact may be formed in the opening. Then the sacrificial structure may be removed to provide space in which to form the remainder of the double-sided capacitor or the contact. To form the double-sided capacitor, the bottom electrode may be formed in the opening 70. The bottom electrode may be formed from a conductive material, such as polysilicon or TiN, and deposited by techniques known in the art. As described in detail below, the sacrificial structure may be removed before forming the dielectric layer or the top electrode. The dielectric layer 130, as shown in FIG. 13, may be formed from an insulative material including, but not limited to, $Ta_2O_5$, $SrTiO_3$, $Y_2O_3$, $Nb_2O_5$, $ZrO_2$, and titanium oxide, and deposited by techniques known in the art. The top electrode may be formed from a conductive material, such as polysilicon or TiN, and deposited by techniques known in the art.

In one embodiment, the double-sided capacitor is formed in the opening 70, as shown in FIGS. 8-13. While forming the double-sided capacitor may require additional deposition and etch steps compared to conventional processes of forming double-sided capacitors, fewer photoprocessing steps, such as etching and masking steps, may be necessary. In addition, since the electrodes and dielectric layer of the double-sided capacitor do not protrude from the surface of the semiconductor wafer 20, the semiconductor wafer 20 may be globally planarized with fewer concerns about breaking the electrodes. As shown in FIG. 8, the opening 70 is formed in the second insulating layer 62, which is a layer of PSG, as previously described. The opening 70 may be formed overlying the plug 60, so that when the double-sided capacitor is complete, the plug 60 and double-sided capacitor may be in electrical connection. A barrier layer 80, such as a silicon nitride layer, is exposed at the bottom of the opening 70. Below the barrier layer 80 is an oxide layer 82, such as a layer formed of low silane oxide ("LSO") oxide.

Figure 10:
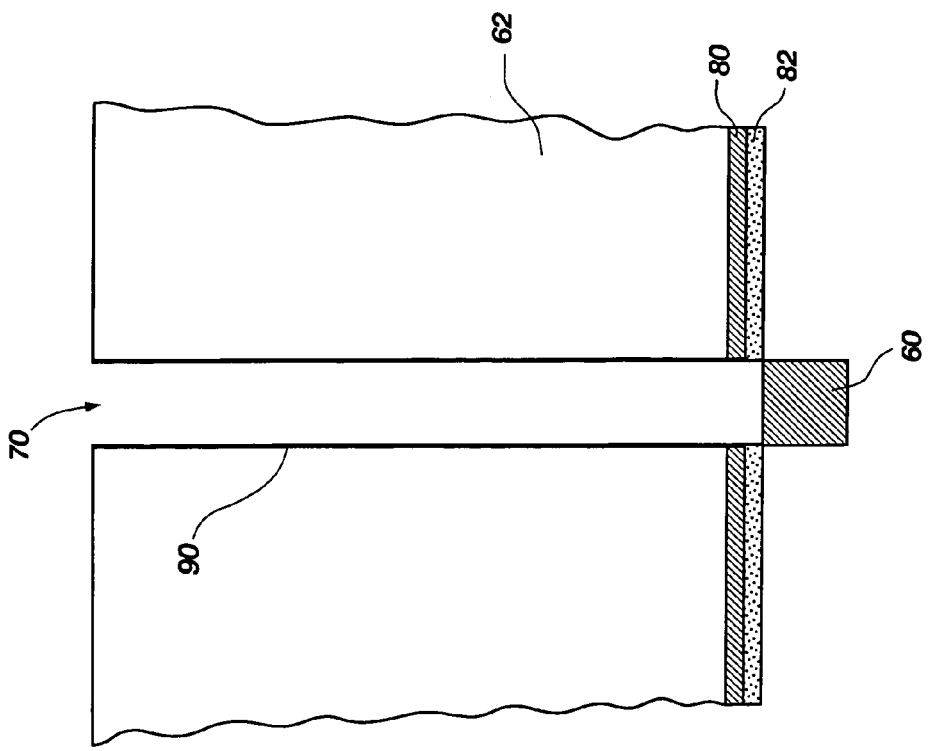

The sacrificial liner 90 may be deposited in the opening 70 as a thin layer, as shown in FIG. 9. The sacrificial liner 90 may be deposited by CVD at a thickness of approximately 75 Å. Portions of the sacrificial liner 90 overlying the top surface of the second insulating layer 62 may be removed, such as by CMP or etching. As previously described, the sacrificial liner 90 is formed from a material that is capable of being selectively etched without damaging other structures on the semiconductor wafer 20. In this embodiment, the sacrificial liner 90 is desirably formed from polysilicon or HSG. While a MIM capacitor is described in this embodiment, an MIS capacitor may be formed using the method of the present invention by forming the sacrificial liner 90 from TiN. A portion of the sacrificial liner 90 may be etched from the bottom of the opening 70 to expose the underlying barrier layer 80. The remainder of the sacrificial liner 90 remains continuous along the sidewalls of the opening 70 to ultimately provide the double-sidedness of the container capacitor. The exposed portion of the barrier layer 80 may be etched to open the bottom of the container capacitor and expose a portion of the oxide layer 82. The sacrificial liner 90 and the barrier layer 80 may be etched by conventional techniques, such as by a dry etch or a wet etch. While these portions of the sacrificial liner 90 and the barrier layer 80 are described as being etched separately, these structures may be etched simultaneously by selecting etchants and etching conditions that remove both the portion of the sacrificial liner 90 and the portion of the barrier layer 80. The exposed portion of the oxide layer 82 may then be etched to expose the plug 60, as shown in FIG. 10.

Figure 11:
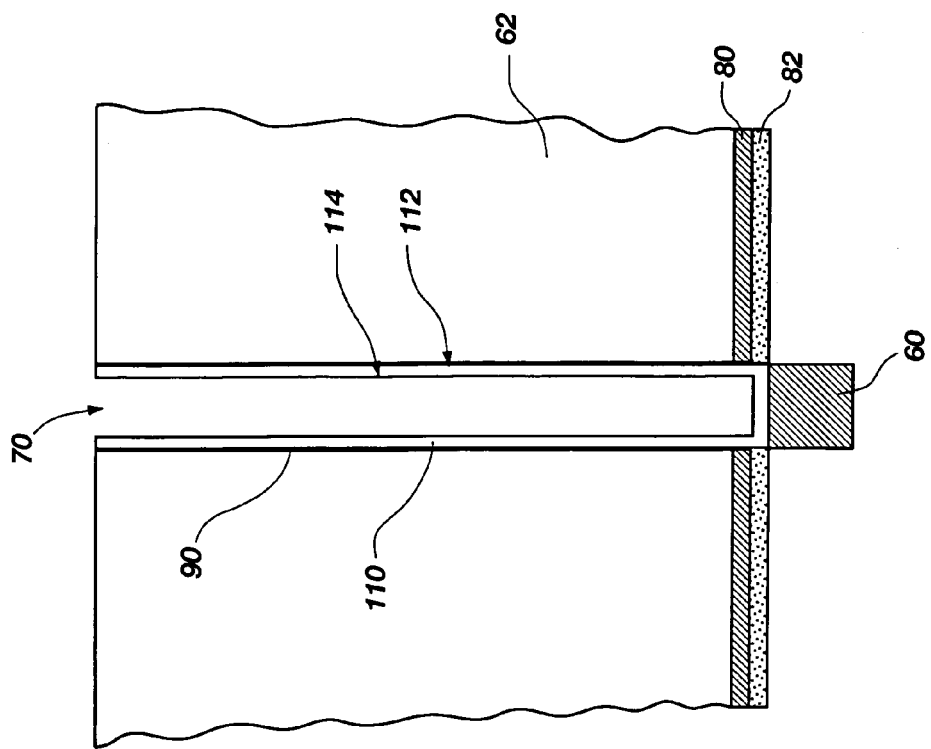

The bottom electrode 110 may be deposited in the opening 70, as shown in FIG. 11, by a suitable deposition technique including, but not limited to, CVD, low pressure chemical vapor deposition ("LPCVD"), plasma enhanced chemical vapor deposition ("PECVD"), metallo organic chemical vapor deposition ("MOCVD"), or sputtering. The bottom electrode 110 may be formed from TiN and have a thickness from approximately 100 Å to approximately 1000 Å. The bottom electrode 110 may have a first surface 112 that contacts the sacrificial liner 90 and a second surface 114. A photoresist layer (not shown) may be deposited over the sidewalls of the opening 70 and the top surface of the second insulation layer 62. Portions of the bottom electrode 110 and the photoresist layer overlying the top surface of the second insulating layer 62 may be removed by CMP to electrically isolate the bottom electrode 110 in the opening 70 and to expose the sacrificial liner 90.

Figure 12:
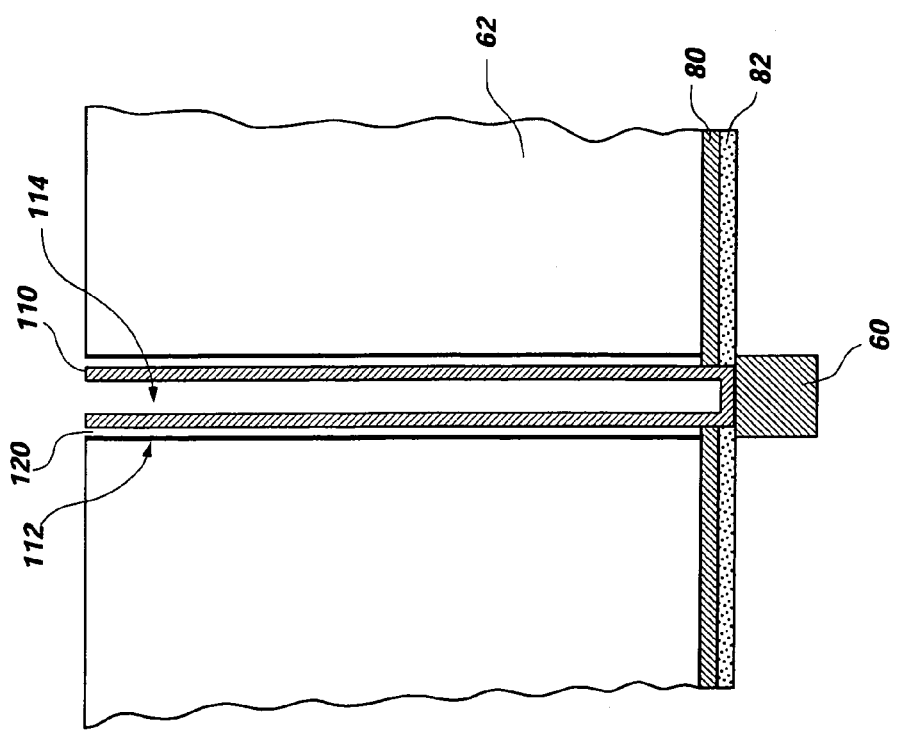

The sacrificial liner 90, which is formed from polysilicon or HSG, may be removed from the opening 70 without damaging or etching the bottom electrode 110 or other components on the semiconductor wafer 20, as shown in FIG. 12. Trimethylammonium hydroxide ("TMAH") may be used to remove the sacrificial liner 90. However, if the sacrificial liner 90 is formed from TiN and the bottom electrode 110 is formed from polysilicon, an etch solution of hydrogen peroxide ("$H_2O_2$") and sulfuric acid ("$H_2SO_4$") may be used. Since the bottom electrode 110 is deposited over the sacrificial liner 90, the first surface 112 of the bottom electrode 110 may be exposed when the sacrificial liner 90 is removed. Therefore, surface area on both the first surface 112 and the second surface 114 of the bottom electrode 110 is available for use in the double-sided capacitor. After removing the sacrificial liner 90, an open space 120 may be present between the first surface 112 of the bottom electrode 110 and the second insulating layer 62. The size of the open space 120 may be further increased using an etchant and etching conditions that remove a portion of the second insulating layer 62 on the outside of the opening 70, which provides additional space in which to form the double-sided capacitor. For the sake of example only, the portion of the second insulating layer 62 may be removed using hydrogen fluoride ("HF").

As shown in FIG. 13, the dielectric layer 130 may be deposited on both the first surface 112 and the second surface 114 (see FIG. 12), of the bottom electrode 110. The dielectric layer 130 is formed from $Ta_2O_5$ and deposited by CVD. The top electrode 132 may then be deposited over the dielectric layer 130 to form the double-sided capacitor 134. The top electrode 132 may be formed from polysilicon or TiN and deposited by CVD to evenly coat the high aspect area features.

The double-sided capacitor having increased capacitance may be formed using at least one sacrificial structure, such as a sacrificial liner or a sacrificial plug. The sacrificial structure may be used to maintain the integrity of the opening while the double-sided capacitor is formed. The increased capacitance may be achieved by forming an opening that has an increased height compared to the opening described in the previous embodiment. Thus, a double-sided capacitor having twice the height of the double-sided capacitor described in the previous embodiment may be formed, which provides increased charge storage in a limited memory cell. While this embodiment may require additional processing compared to conventional techniques of forming the double-sided capacitor, increased capacitance and robust contacts may be achieved.

The sacrificial liner 90 may be deposited in the opening 70 and over a top surface of the second insulating layer 62. The sacrificial liner 90 may be deposited by a suitable deposition technique, such as by CVD. Portions of the sacrificial liner 90 extending over the surface of the second insulating layer 62 may be removed by CMP or by etching so that the sacrificial liner 90 lines the sidewalls of the opening 70, as shown in FIG. 15. A sacrificial plug 142 may be deposited in the opening 70 and over a top surface of the second insulating layer 62. Portions of the sacrificial plug 142 that extend over the surface of the second insulating layer 62 may be removed by CMP or by etching. The sacrificial plug 142 may be used to maintain the space in which the bottom electrode 110 of the double-sided capacitor will ultimately be deposited. The sacrificial liner 90 and sacrificial plug 142 may be formed from materials having different etch selectivities so that either of these sacrificial structures may be selectively removed without removing or damaging the other sacrificial structure or other components on the semiconductor wafer 20. For instance, the sacrificial liner 90 may be formed from TiN while the sacrificial plug 142 may be formed from polysilicon or HSG. Alternatively, the sacrificial liner 90 may be formed from polysilicon or HSG while the sacrificial plug 142 may be formed from TiN. An interfacial oxide 144 may also be present at the surface of the plug 60.

A third insulating layer 150 may be formed over the second insulating layer 62, as shown in FIG. 16. The third insulating layer 150 may be formed from BPSG or PSG. An opening 70' may be formed in the third insulating layer 150 and extended through to the top surface of the second insulating layer 62 so that the opening 70' is substantially aligned with opening 70. Sacrificial liner 90' may be deposited in the opening 70' so that it covers the sidewalls of opening 70' and over a top surface of the third insulating layer 150 (see FIG. 17). The sacrificial liner 90 and sacrificial liner 90' may be substantially aligned. As shown in FIG. 17, portions of the sacrificial liner 90' extending over the top surface of the third insulating layer 150 may be removed, such as by CMP or by etching so that the sacrificial liner 90' lines the sidewalls of the opening 70'. Alternatively, the sacrificial liner 90 may be removed from opening 70, such as by using an etch solution of 5%-15% $H_2O_2$, 60%-90% $H_2SO_4$, and 5%-15% $H_2O$ at a temperature of approximately 90° C. to approximately 150° C. It is also contemplated that additional etch solutions that selectively remove the sacrificial liner 90 without damaging or removing other structures on the semiconductor wafer may be used. A single sacrificial liner 90" may then be deposited in openings 70 and 70', as shown in FIG. 18.

The sacrificial plug 142 may be selectively removed from the opening 70 by conventional techniques, such as by etching. For instance, if the sacrificial plug 142 is formed from polysilicon or HSG, TMAH may be used to etch the sacrificial plug 142 without damaging the sacrificial liner 90" (or sacrificial liners 90 and 90') or other exposed components on the semiconductor wafer 20. The interfacial oxide 144 present at the top of the plug 60 may prevent overetching when the sacrificial plug 142 is removed. The bottom electrode 110 may be applied over the sacrificial liner 90" (or sacrificial liners 90 and 90'), and portions of the bottom electrode layer removed from the top surface of the third insulating layer 150 to expose the sacrificial liners 90, 90' (or 90"). After the bottom electrode 110 is deposited, a photoresist layer (not shown) may be deposited to protect the electrode surface while the top surface of the third insulating layer 150 is cleaned.

The sacrificial liner 90" (or sacrificial liners 90 and 90') may then be selectively removed from the openings 70, 70', as shown in FIG. 19, without damaging exposed components on the semiconductor wafer 20 using an etch solution of $H_2O_2$ and $H_2SO_4$, as previously described. By using and removing the sacrificial liner 90" (or sacrificial liners 90 and 90'), a first surface 112 of the bottom electrode 110 may be exposed inside the openings 70, 70'. Both surfaces 112, 114 of the bottom electrode 110 may be covered with the dielectric layer 130 and the top electrode 132, as shown in FIG. 20, to create the double-sided capacitor 134 having the increased height and increased capacitance.

By using the sacrificial liner 90" (or sacrificial liners 90 and 90') to offset the bottom electrode 110 sidewall from the wall of the opening 70, the double-sided capacitor 134 may have an increased surface area. In addition, by keeping the thickness of the sacrificial liner 90" (or sacrificial liners 90 and 90') reduced and selectively removing the sacrificial liner 90" (or sacrificial liners 90 and 90') and additional portions of the third insulating layer 150, an outside diameter of the bottom electrode 110 may be substantially the same as the diameter of the originally etched opening 70, yet still have sufficient space for achieving conformal coverage of the dielectric layer 130 and the top electrode 132. However, even if the portion of the total capacitance from the inner surface of the double-sided capacitor 134 may be substantially smaller than that of the outer surface, forming a "single-outsided" double-sided capacitor 134, the capacitance of the double-sided capacitor 134 may nevertheless be significant.

In addition, with the method of the present invention, the bottom electrodes 110 may be offset from one another with the intervening area to be filled with the material of the top electrode 132. Therefore, bridging together of the bottom electrodes 110 may improve the effective sheet resistance of the top electrode 132. In contrast, in conventional double-sided capacitors, if the bottom electrode 110 is formed inside the opening 70, utmost care must be taken so that adjacent bottom electrodes do not bridge together.

The sacrificial structure may also be used to form a contact in opening 70" in the second insulating layer 62, as shown in FIG. 21. After the opening 70" is formed, as previously described, the sacrificial liner 90 may be deposited in the opening 70" and over a top surface of the second insulating layer 62. The sacrificial liner 90 may be deposited by a suitable deposition technique, such as by CVD. Portions of the sacrificial liner 90 extending over the surface of the second insulating layer 62 may be removed by CMP or by etching so that the sacrificial liner 90 lines the sidewalls of the opening 70". A sacrificial plug 142 may be deposited in the opening 70" and over a top surface of the second insulating layer 62. Portions of the sacrificial plug 142 that extend over the surface of the second insulating layer 62 may be removed by CMP or by etching. A fourth insulating layer 210 may then be formed over the second insulating layer 62 and an opening 70''' formed therein, as shown in FIGS. 22 and 23. The opening 70''' may be in substantial alignment with opening 70".

Figure 26:
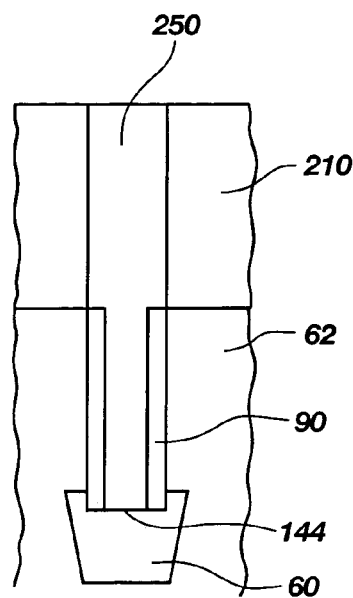
Figure 27:
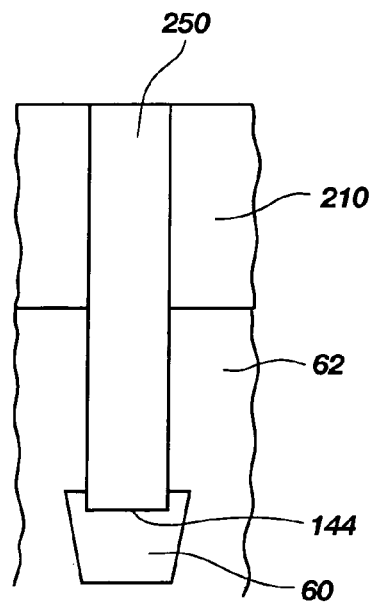

As shown in FIG. 24, the sacrificial plug 142 may be selectively removed from the opening 70''' by conventional techniques, such as by etching. For instance, if the sacrificial plug 142 is formed from polysilicon, TMAH may be used to remove the sacrificial plug 142 without damaging the sacrificial liner 90 or other exposed components on the semiconductor wafer 20. The interfacial oxide 144 at the top of the plug 60 may prevent overetching when the sacrificial plug 142 is removed. If the sacrificial liner 90 is formed from a conductive material, such as TiN, the sacrificial liner 90 may remain in the opening 70'''. Alternatively, both the sacrificial plug 142 and the sacrificial liner 90 may be removed from the opening 70''', as shown in FIG. 25. For instance, if the sacrificial plug 142 is formed from polysilicon and the sacrificial liner 90 is formed from TiN, TMAH may be used to remove the sacrificial plug 142 while the solution of $H_2O_2$ and $H_2SO_4$ is used to remove the sacrificial liner 90. A conductive material, such as a conductive metal, may then be used to fill in the openings 70", 70''', as shown in FIGS. 26 and 27. Conductive material that may be present on the surface of the fourth insulating layer 210 may be removed by CMP to form contact plug 250.

Figure 28:
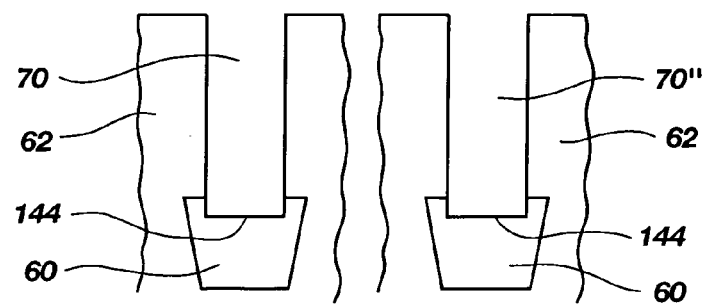
FIGS. 28 and 29 are cross-sectional views of a portion of the semiconductor wafer according to another embodiment of the present invention.
Figure 29:
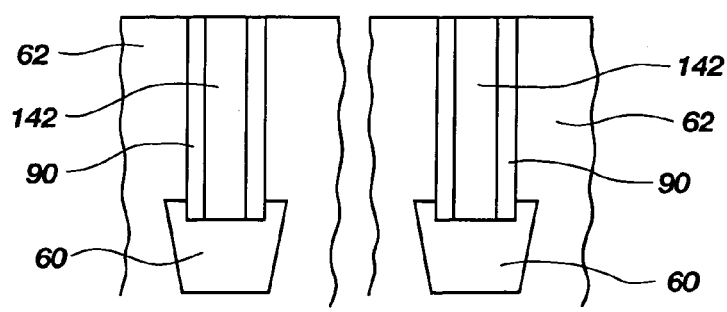

It is also contemplated that portions of the double-sided capacitor 134 may be formed in openings 70, 70' at the same time as portions of the contact plug 250 are formed in openings 70", 70''' as shown in FIGS. 28 and 29. As shown in FIG. 28, openings 70 and 70" for the double-sided capacitor 134 and the contact plug 250, respectively, may be simultaneously formed in the second insulating layer 62. The openings 70, 70" may be formed as previously described. Openings 70, 70" may be sequentially formed in the second insulating layer 62 without departing from the scope of the present invention. The sacrificial liner 90 and the sacrificial plug 142 may be formed in each of the openings 70, 70", as shown in FIG. 29. The sacrificial liner 90 and the sacrificial plug 142 may be formed as described above.

At this point, separate processing to form the double-sided capacitor 134 and the contact plug 250 may be required. For instance, the third insulating layer 150 may be formed over the second insulating layer 62 and opening 70' formed therein to form the double-sided capacitor 134, as previously described and illustrated in FIGS. 15-20. Once the double-sided capacitor 134 is formed, the fourth insulating layer 210 may be formed over the second insulating layer 62. The fourth insulating layer 210 may be deposited so that the double-sided capacitor 134 is covered by the fourth insulating layer 210. To form the contact plug 250, opening 70''' may be formed in the fourth insulating layer 210 as previously described and illustrated in FIGS. 22-27. The disposable nature of the sacrificial liner 90 and the sacrificial plug 142 used in the present invention ensures that changes in conductive characteristics do not impact the semiconductor device structure since the sacrificial liner 90 and the sacrificial plug 142 may be subsequently removed.

Since the openings 70', 70" in the third and fourth insulating layers 150, 210 are formed to a depth that spans the thickness of these layers, to make contact with and align with the openings 70, 70", fewer constraints may be placed on the processing technology. By using the sacrificial liner 90 and the sacrificial plug 142 in the openings 70, 70', 70", 70''', the integrity of these openings may be maintained, which allows the double-sided capacitor 134 having an increased height and contact plug 250 to be formed. The double-sided capacitor 134 and contact plug 250 may provide an increased capacitance of the memory cell without affecting the ability to make robust electrical contacts. For instance, by filling the opening 70" with the sacrificial liner 90 and the sacrificial plug 142 while the double-sided capacitor 134 is formed, the integrity of the contact plug 250 may be maintained.

While the embodiments herein describe forming the double-sided capacitor 134 having a height that is double the height of conventional double-sided capacitors, double-sided capacitors having increased heights may be formed by repeating the steps previously described.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. An intermediate semiconductor device structure for forming a double-sided capacitor, comprising:
   a semiconductor wafer comprising at least one opening in a first insulating layer thereof, the semiconductor wafer defining a precursor structure to a double-sided capacitor comprising:
      a first sacrificial liner in contact with sidewalls of the at least one opening in the first insulating layer;
      a sacrificial plug substantially filling the at least one opening in the first insulating layer;
      at least one opening in a second insulating layer formed over the first insulating layer, the at least one opening in the second insulating layer exposing the sacrificial plug; and
      a second sacrificial liner in contact with sidewalls of the at least one opening in the second insulating layer, the second sacrificial liner in substantial alignment with the first sacrificial liner.

2. The intermediate semiconductor device structure of claim 1, wherein the sacrificial plug is formed from a material having a different etch selectivity than the material of the first sacrificial liner.

3. The intermediate semiconductor device structure of claim 1, wherein the first sacrificial liner is formed from titanium nitride and the sacrificial plug is formed from one of polysilicon and hemispherical grain polysilicon.

4. The intermediate semiconductor device structure of claim 1, wherein the first sacrificial liner is formed from one of polysilicon and hemispherical grain polysilicon and the sacrificial plug is formed from titanium nitride.

5. The intermediate semiconductor device structure of claim 1, wherein the at least one opening in the second insulating layer is in substantial alignment with the at least one substantially filled opening in the first insulating layer.

* * * * *

UNITED STATES PATENT AND TRADEMARK OFFICE
CERTIFICATE OF CORRECTION

PATENT NO.         : 7,321,150 B2
APPLICATION NO. : 11/030696
DATED                  : January 22, 2008
INVENTOR(S)        : Fishburn et al.

Page 1 of 1

It is certified that error appears in the above-identified patent and that said Letters Patent is hereby corrected as shown below:

In column 1, line 9, delete "10/714,415" and insert -- 10/714,115 --, therefor.

Signed and Sealed this

Twentieth Day of May, 2008

JON W. DUDAS
*Director of the United States Patent and Trademark Office*